United States Patent [19]

Noguchi et al.

[11] 3,933,509
[45] Jan. 20, 1976

[54] PHOTO-POLYMERIZABLE COMPOSITION CONTAINING AN ACID SALT OF AN INDOLINOBENZOSPIROPYRAN

[75] Inventors: Yasuhiro Noguchi; Syu Watarai; Chiaki Osada; Hisatake Ono, all of Asaka, Japan

[73] Assignee: Fuji Photo Film Co., Ltd., Minami-ashigara, Japan

[22] Filed: Aug. 22, 1973

[21] Appl. No.: 390,671

[30] Foreign Application Priority Data
Aug. 23, 1972 Japan............................ 47-84383

[52] U.S. Cl............. 96/115 P; 96/115 R; 96/90 PC; 204/159.14; 204/159.23; 260/326.11 SP
[51] Int. Cl.².... G03C 1/68; C08F 2/46; C08F 8/00; C07D 209/04
[58] Field of Search.......... 96/115 R, 115 P, 90 PC; 204/159.23, 159.14; 260/326.11 SP

[56] References Cited
UNITED STATES PATENTS

| | | | |
|---|---|---|---|
| 3,642,484 | 2/1972 | Poot | 96/115 P |
| 3,652,985 | 3/1972 | Delzenne et al. | 96/115 P |
| 3,894,628 | 4/1974 | Osada et al. | 96/115 R |

*Primary Examiner*—Jack P. Brammer
*Attorney, Agent, or Firm*—Sughrue, Rothwell, Mion, Zinn & Macpeak

[57] ABSTRACT

A photo-polymerizable composition comprising (A) a photopolymerization initiator comprising at least one inorganic or organic acid salt of an indolinobenzospiropyran represented by the following general formula (I):

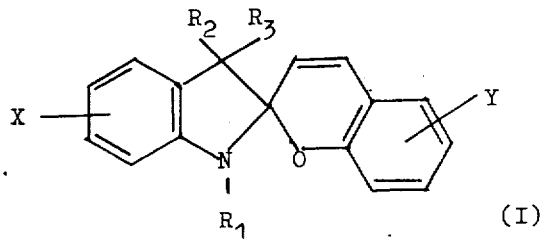

wherein $R_1$ represents an alkyl group, substituted alkyl group or a phenyl group; $R_2$ and $R_3$ each represents an alkyl group or a phenyl group or, when taken together, $R_2$ and $R_3$ form a methylene chain

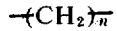

wherein $n$ is an integer of 4 or 5; X represents a hydrogen atom, a nitro group, a halogen atom, a carboxy group; and Y represents one or more substituents selected from the group consisting of a hydrogen atom, a nitro group, a halogen atom, a formyl group and an alkoxy group, and (B) at least one cationically polymerizable substance.

16 Claims, No Drawings

PHOTO-POLYMERIZABLE COMPOSITION CONTAINING AN ACID SALT OF AN INDOLINOBENZOSPIROPYRAN

BACKGROUND OF THE INVENTION

1. Field of the Invention

The present invention relates to a novel photopolymerizable composition.

2. Description of the Prior Art

The photo-polymerization method is extremely important in the preparation of photo resists, light-sensitive printing plates or the like. Heretofore, as the photopolymerization process, a free radical process wherein polymerization is initiated by free radicals produced by the action of light has been employed. However, this free radical process has serious disadvantages in that this reaction is inhibited by molecular oxygen, and in that monomers which can not be polymerized by initiation with free radicals cannot be used.

A polymerization reaction initiated by a cation, i.e., a cationic polymerization process, is also well known in the field of high polymer chemistry. For example, a description of this process is given in P. J. Flory; "Principle of Polymer Chemistry", p.217 et seq., Cornell Co. Ltd., As the initiator of this cationic polymerization, there are Lewis acids, i.e., compounds capable of accepting an electron pair, proton acids, i.e., compounds capable of releasing a proton, and the like. As examples thereof, boron trifluoride, aluminum chloride, hydrogen halogenide, sulfuric acid, etc. are known.

As the compounds known as the so-called photo cationic polymerization initiators capable of releasing a cationic polymerization-initiating agent upon being exposed to light, there are, e.g., the boron fluoride salts of aromatic diazonium compounds described in Belgian Pat. No. 593,648; and the polyboron salts described in U.S. Pat. No. 3,196,098 and Japanese patent publication No. 27561/68.

SUMMARY OF THE INVENTION

The novel photo-polymerizable composition of the present invention comprises an organic or inorganic quaternary salt of an indolinobenzospiropyran derivative as a photo-cationic polymerization initiator and a substance capable of being cationically polymerized. Upon being exposed to electromagnetic radiation of a wavelength of 250 m$\mu$ to 700 m$\mu$ this composition photopolymerizes and, at the same time, undergoes a change in the optical density in visible region.

The above-described indolinobenzospiropyran derivative is represented by the following general formula (I):

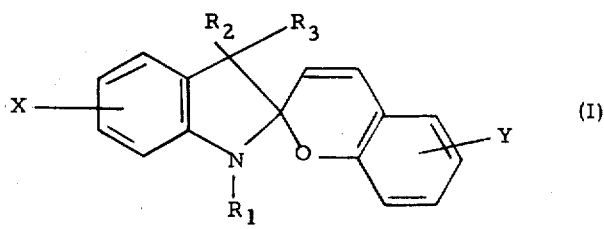

wherein $R_1$ represents an alkyl group, substituted alkyl group or a phenyl group; $R_2$ and $R_3$ each represents an alkyl group or a phenyl group or, when taken together, $R_2$ and $R_3$ form a methylene chain $-(CH_2)-_n$ wherein $n$ is an integer of 4 or 5; X represents a hydrogen atom, a nitro group, a halogen atom, a carboxy group, an alkoxycarbonyl group, an alkyl group or an alkoxy group; and Y represents one or more substituents selected from the group consisting of a hydrogen atom, a nitro group, a halogen atom, a formyl group and an alkoxy group.

DETAILED DESCRIPTION OF THE INVENTION

Figure 1:
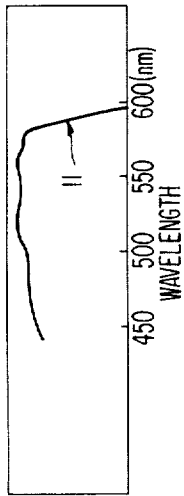
Figure 2:
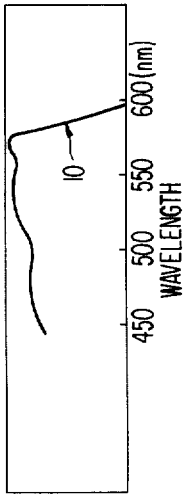
Figure 3:
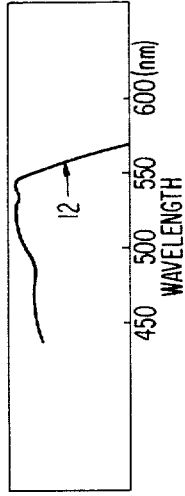
Figure 4:
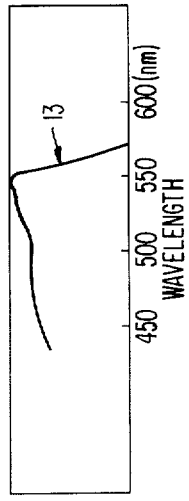
Figure 5:
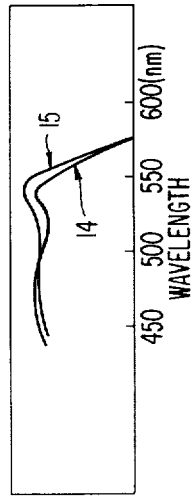
Figure 6:
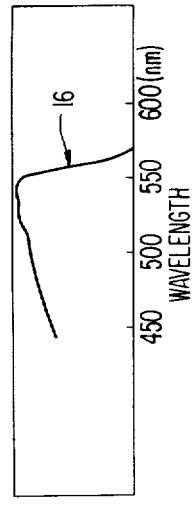
Figure 7:
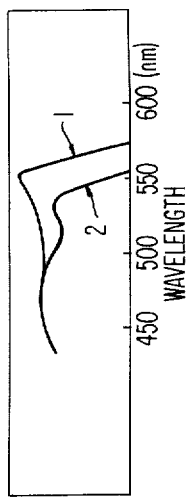
Figure 8:
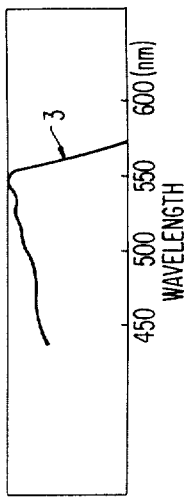
Figure 9:
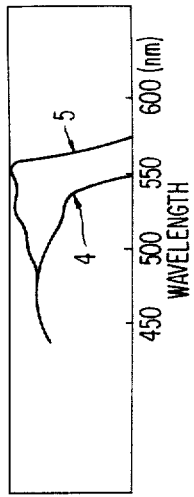
Figure 10:
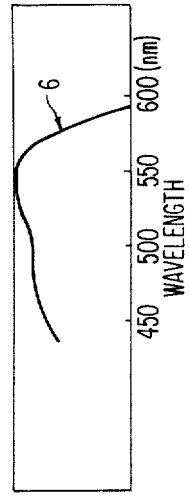
Figure 11:
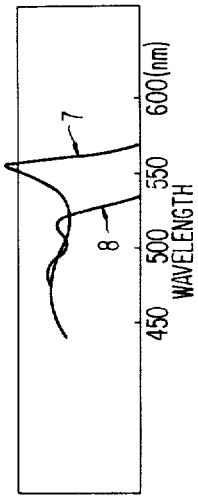
Figure 12:
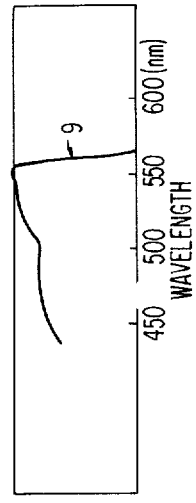

As set forth above, the photo-cationic polymerization initiator of this invention has the general formula (I). In a preferred embodiment, $R_1$ represents an alkyl group having 1 – 5 carbon atoms, a substituted alkyl group having 1 – 5 carbon atoms (the substituent being a carboxyl group, a cyano group, an alkoxycarbonyl group having 2 – 6 carbon atoms, a hydroxy group, a halogen atom, an alkoxy group having 1 – 5 carbon atoms or a phenyl group), or a phenyl group; $R_2$ and $R_3$ each represents an alkyl group having 1 – 5 carbon atoms or a phenyl group or, when taken together, $R_2$ and $R_3$ form a methylene chain $-(CH_2)-_n$, wherein $n$ is an integer of 4 or 5; X represents a hydrogen atom, a nitro group, a halogen atom, a carboxy group, an alkoxycarbonyl group having 2 – 6 carbon atoms, an alkyl group having 1 – 5 carbon atoms or an alkoxy group having 1 – 5 carbon atoms; and Y represents one or more substituents selected from the group consisting of a hydrogen atom, a nitro group, a halogen atom, a formyl group, and an alkoxy group having 1 – 5 carbon atoms.

Suitable alkyl groups as above described are methyl, ethyl, propyl, isopropyl, butyl, isobutyl, sec-butyl, and pentyl groups; suitable alkoxy groups are methoxy, ethoxy, propoxy, isopropoxy, butoxy, and amyloxy groups; suitable alkoxy carbonyl groups are methoxycarbonyl, propoxycarbonyl, isopropoxycarbonyl, butoxycarbonyl and amyloxycarbonyl groups.

Indolinobenzospiropyran derivatives are known as the photochromic compounds undergoing reversible change in color upon irradiation with light. These compounds and a process for synthesizing them are described in, for example, U.S. Pat. Nos. 2,953,454; and 3,022,318; and E. Berman, J. Am. Chem. Soc., 81, 5605 (1959).

Specific examples of typical compounds represented by the general formula (I) are as follows:

1,3,3-Trimethylspiro(indoline-2,2'-2'H-chromene),
1,3,3-Trimethyl-8'-formylspiro(indoline-2,2'-2'H-chromene),
1,3,3-Trimethyl-6',8'-dichlorospiro(indoline-2,2'-2'H-chromene),
1,3,3-Trimethyl-8'-methoxyspiro(indoline-2,2'-2'H-chromene),
1,3,3-Trimethyl-6'-nitrospiro(indoline-2,2'-2'H-chromene),
1,3,3-Trimethyl-6',8'-dibromospiro(indoline-2,2'-2'H-chromene), 1,3,3-Trimethyl-5',7'-dichloro-6'-nitrospiro(indoline-2,2'-2'H-chromene),
1,3,3-Trimethyl-8'-formyl-6'-nitrospiro(indoline-2,2'-2'-H-chromene),
1,3,3-Trimethyl-8'-methoxy-6'-nitrospiro(indoline-2,2'-2'-H-chromene),
1-Ethyl-3,3-dimethyl-6'-nitrospiro(indoline-2,2'-2'H-chromene),
1-Propyl-3,3-dimethyl-6'-nitrospiro(indoline-2,2'-2'H-chromene),
1-Butyl-3,3-dimethyl-6'-nitrospiro(indoline-2,2'-2'H-chromene),
1,3,3-Trimethyl-5-methyl-6'-nitrospiro(indoline-2,2'-2'H-chromene),
1,3,3-Trimethyl-5-methyl-8'-methoxy-6'-nitrospiro (indoline-2,2'-2'H-chromene),
1,3,3-Trimethyl-5-methyl-5',7'-dichloro-6'-nitrospiro (indoline-2,2'-2'H-chromene),
1,3,3-Trimethyl-5-methoxyspiro(indoline-2,2'-2'H-chromene),
1,3,3-Trimethyl-5-methoxy-6'-nitrospiro(indoline-2,2'-2'H-chromene),
1,3,3-Trimethyl-5-methoxy-8'-methoxy-6'-nitrospiro (indoline-2,2'-2'H-chromene),
1,3,3-Trimethyl-5-chlorospiro(indoline-2,2'-2'H-chromene),
1,3,3-Trimethyl-5-chloro-6'-nitrospiro(indoline-2,2', 2'H-chromene),
1,3,3-Trimethyl-5-chloro-8'-methoxy-6'-nitrospiro (indoline-2,2'-2'H-chromene),
1,3,3-Trimethyl-5-chloro-6',8'-dibromospiro(indoline-2,2'-2'H-chromene),
1,3,3-Trimethyl-5-nitrospiro(indoline-2,2'-2'-H-chromene),
1,3,3-Trimethyl-5,6'-dinitrospiro(indoline-2,2'-2'H-chromene),
1,3,3-Trimethyl-5,6'-dinitro-8'-methoxyspiro(indoline-2,2'-2'H-chromene),
1,3,3-Trimethyl-5-nitro-6',8'-dibromospiro(indoline-2,2'-2'H-chromene),
1,3,3-Trimethyl-5-ethoxycarbonyl-6'-nitrospiro (indoline-2,2'-2'H-chromene),
1,3,3-Trimethyl-5-ethoxycarbonyl-8'-methoxy-6'-nitrospiro(indoline-2,2'-2'-H-chromene),
6',8'-Dibromospiro(indoline-2,2'-2'H-chromene),
1-Benzyl-3,3-dimethyl-6'-nitrospiro(indoline-2,2'-2'H-chromene),
1-Benzyl-3,3-dimethyl-8'-methoxy-6'-nitrospiro (indoline-2,2'-2'H-chromene),
1-Carboxyethyl-3,3-dimethyl-6'-nitrospiro(indoline-2,2'-2'H-chromene),
1-Carboxyethyl-3,3-dimethyl-9'-methoxy-6'-nitrospiro(indoline-2,2'-2'H-chromene),
3,3-Dimethyl-1-β-ethoxycarbonylethyl-6'-nitrospiro (indoline-2,2'-2'H-chromene),
1-Cyanoethyl-3,3-dimethylspiro(indoline-2,2'-2'H-chromene),
1-Cyanoethyl-3,3-dimethyl-6'-nitrospiro(indoline-2,2'-2'H-chromene),
1-Cyanoethyl-3,3-dimethyl-8'-methoxy-6'-nitrospiro (indoline-2,2'-2'H-chromene),
1-Carboxypropyl-3,3-dimethyl-6'-nitrospiro(indoline-2,2'-2'H-chromene),
1-Carboxypropyl-3,3-dimethyl-8'-methoxy-6'-nitrospiro (indoline-2,2'-2'H-chromene),
1-γ-Carboethoxypropyl-3,3-dimethylspiro(indoline-2,2'-2'H-chromene),
1-γ-Carboethoxypropyl-3,3-dimethyl-6'-nitrospiro (indoline-2,2'-2-H-chromene),
1-γ-Carboethoxypropyl-3,3-dimethyl-8'-methoxy-6'-nitrospiro(indoline-2,2'-2'H-chromene),
1-ω-Bromobutyl-3,3-dimethylspiro(indoline-2,2'-2'H-chromene),
1-ω-Bromobutyl-3,3-dimethyl-6'-nitrospiro(indoline-2,2'-2'H-chromene),
1-ω-Bromobutyl-3,3-dimethyl-8'-methoxy-6'-nitrospiro (indoline-2,2'-2'H-chromene),
3,3-Dimethyl-1-hydroxyethylspiro(indoline-2,2'-2'H-chromene),
3,3-Dimethyl-1-hydroxyethyl-6'-nitrospiro(indoline-2,2'-2'H-chromene),
3,3-Dimethyl-1-hydroxyethyl-8'-methoxy-6'-nitrospiro (indoline-2,2'-2'H-chromene),
3,3-Dimethyl-1-methoxyethyl-6'-nitrospiro(indoline-2,2'-2'H-chromene),
3,3Dimethyl-1-methoxyethyl-8'-methoxy-6'-nitrospiro (indoline-2,2'-2'H-chromene),
3,3-Dimethyl-1-phenyl-6'-nitrospiro(indoline-2,2'-2'H-chromene),
3,3-Dimethyl-1-phenyl-8'-methoxy-6'-nitrospiro (indoline-2,2'-2'-H-chromene),
1,3-Dimethyl-3-ethylspiro(indoline-2,2'-2'H-chromene),
1,3-Dimethyl-3-ethyl-6'-nitrospiro(indoline-2,2'-2'H-chromene),
1,3-Dimethyl-3-ethyl-8'-methoxy-6'-nitrospiro(indoline-2,2'-2'H-chromene),
1,3-Dimethyl-3-phenyl-6'-nitrospiro(indoline-2,2'-2'H-chromene),
1Methyl-6-nitro-2'H-chromene-2-spiro-2'-indoline-3'-spiro-1'''-cyclohexane,
1'-Methyl-6-nitro-2H-chromene-2-spiro-2'-indoline-3'-spiro-1'''-cyclopentane,
1'-Methyl)-6-nitro-8-methoxy-2H-chromene-2-spiro-2'-indoline-3'-spiro-1'''-cyclopentane.

As the organic and inorganic acids effective for producing salts with the above-described indolinobenzospiropyran derivatives, all Lewis acids and proton acids that are known to be effective as an initiator of the cationic polymerization reaction can be used.

Lewis acids effective as the cationic polymerization catalyst are of the Friedel-Crafts type and halides of elements widely ranging from Groups II to V and VIII of the Periodic Table, e.g., Groups IIA, IIB, IIIA, IIIB, IVA, IVB, VB and VIII are used. As these halides, the fluorides, chlorides or bromides are often employed. Where the metal can be in either of two different oxidation states, the higher oxidation state shows greater activity.

Specific examples of these known compounds include aluminum chloride, aluminum bromide, beryllium chloride, cadmium chloride, zinc chloride, boron trifluoride, boron trichloride, boron tribromide, gallium trichloride, titanium tetrachloride, titanium tetrabromide, zirconium tetrachloride, tin tetrachloride, tin tetrabromide, antimony pentachloride, antimony trichloride, bismuth (III) chloride, ferric chloride, uranium tetrachloride, and the like. Catalysts of this type rarely show polymerization activity when used alone and, usually, co-catalysts such as a slight amount of water, alcohol, acetic acid, alkyl halide, etc. are necessary. It is believed that polymerization is initiated by a proton or a carbonium ion released from a complex compound formed from the metal halide or the like and the co-catalyst.

Proton acids effective as the cationic polymerization catalyst, are inorganic acids and organic acids such as carboxylic acids (e.g., having 1 to about 8 carbon atoms), sulfonic acids (e.g., having 1 to about 7 carbon atoms), phenolic compounds (e.g., having 6 to about 8 carbon atoms), etc. Typical examples thereof are inorganic acids such as the hydrohalogenic acids (e.g., hydrofluoric acid, hydrochloric acid, hydrobromic acid), sulfuric acid, nitric acid, phosphoric acid, perchloric acid, polyphosphoric acid, etc., and organic acids such as acetic acid, sulfanilic acid, dinitro-o-cresol, picric acid, salicylic acid, p-toluenesulfonic acid, benzene-sulfonic acid, oxalic acid, etc.

The salt of indolinobenzenespiropyran derivative used in the invention can be obtained by mixing indolinobenzospiropyran with an acid in a suitable reaction medium such as methanol, ethanol, propanol, tetrahydrofuran, benzene, dioxane, etc. These starting materials are usually mixed in stoichiometrical amounts. However, either of the starting materials can be used in an excess amount where desired. The starting materials are usually mixed under atmospheric pressure at a room temperature. An inert gas atmosphere may be used if desired but is not essential.

If desired, the resulting so-called quaternary salt of indolinobenzospiropyran can be separated from the reaction medium, e.g., by filtering or evaporation of the solvent. However, this separation procedure is in some cases unnecessary and the quaternary salt obtained can be used together with the reaction medium for preparing the above-described photo-polymerizable composition.

A specific example of a process for producing the quaternary salt is described below.

32.2 g of 1,3,3-trimethyl-6'-nitrospiro(indoline-2,2'-2'H-chromene) was dissolved in 2 liters of ethanol under heating (about 60°C) and, while stirring, 50 ml of concentrated hydrochloric acid (12 $\mu$) was added dropwise thereto. The yellow precipitate formed was filtered out, washed with ethanol and dried. Thus, 31.5 g of a yellow powder having a melting point of 260°–267°C was obtained. From the results of the infrared absorption spectrum, determination of the halogen using Beilstein's method and elemental analysis on C, H and N, the product was identified as 1,3,3-trimethyl-6'-nitrospiro(indoline-2,2'-2'H-chromene) monohydrochloride.

In quite the same manner as above, various salts, as listed in Table 1, of 1,3,3-trimethyl-6'-nitrospiro(indoline-2,2'-2'H-chromene) were synthesized.

Table 1

| Acid Used | Melting Point of the Product |
|---|---|
| Hydrochloric Acid | 260 – 261°C |
| Nitric Acid | 159 – 160°C |
| Perchloric Acid | 240 – 242°C |
| Acetic Acid | 158 – 160°C |
| Sulfanilic Acid | 220 – 223°C |
| Benzenesulfonic Acid | 207 – 209°C |
| Toluenesulfonic Acid | 123 – 126°C |
| Dinitro-o-cresol | 121 – 122°C |
| Picric Acid | 230 – 232°C |
| Salicylic Acid | 142 – 143°C |
| Boron trifluoroetherate | 242 – 245°C |
| Ferric Chloride | 252 – 253°C |
| Titanium Trichloride | 257 – 258°C |
| Stannous Chloride | 220 – 221°C |

As cation-polymerizable substances, compounds having an ethylenically unsaturated bond and compounds having a cyclic group (e.g., cyclic ether, imine, lactone, lactam, etc.) which is to be ring-opened for polymerization are examples. Specific examples of these cation-polymerizable substances are described in, e.g., G. E. Ham; "Copolymerization", pp. 238 – 334, Interscience Co. (1964), Japanese patent publication No. 27561/68, and the like.

As the compounds effective for the present invention, there are vinyl-sulfides in addition to the above-described compounds. Specific examples thereof include methyl vinyl sulfide, ethyl vinyl sulfide, isopropyl vinyl sulfide, isobutyl vinyl sulfide, and the like.

These C-vinyl, O-vinyl, S-vinyl and N-vinyl compounds described above generally have from 3 to 20 carbon atoms, preferably 3 to about 12 carbon atoms.

The cation-polymerizable compounds preferable for the invention are vinyl ethers and N-vinyl compounds. These compounds are easy to polymerize and provide polymers having good properties. In addition, they are easily available. Of these, the vinyl ethers are represented by the general formula (II):

wherein X represents an alkyl group having 1 – 10 carbon atoms or a substituted alkyl group having 1 – 10 carbon atoms (the substituent being a halogen atom, an alkoxy group having 1 – 10 carbon atoms, an alkyl group in which the carbon chain is interrupted with an oxygen atom, an aryloxy group, an arylcarboxy group, a halogen-substituted aryloxy group, an aryloxy group substituted with an alkyl group having 1 – 5 carbon atoms, or an aryloxy group substituted with an alkoxy group having 1 –5 carbon atoms).

Typical examples of the compounds represented by the general formula (II) include methyl vinyl ether, ethyl vinyl ether, isobutyl vinyl ether, diisopropyl-methyl vinyl ether, decyl vinyl ether, cetyl vinyl ether, 2-chloroethyl vinyl ether, 2-methoxyethyl vinyl ether, 2(2-ethoxyethoxy)-ethyl vinyl ether, 2-phenoxyethyl vinyl ether, α-naphthoxyethyl vinyl ether, 2-(2,4,6-trichlorophenoxy)ethyl vinyl ether, 2-(2,4,5-trichlorophenoxy)-ethyl vinyl ether, 2-(2,4,6-tribromophenoxy)ethyl vinyl ether, p-methoxy-naphthoxyethyl vinyl ether, p-methoxyphenoxyethyl vinyl ether, 2-vinyloxyethyl benzoate, 3,5-dimethylphenoxyethyl vinyl ether, and the like. In addition, polyfunctional vinyl ethers having two or more ethylenically unsaturated bonds per molecule are also included in the general formula (II). Since polymers produced from the polyfunctional vinyl ethers show greater change in physical properties than polymers produced from monofunctional ones, it is preferable to use the poly-functional vinyl ethers alone or in combination with a mono-functional monomer. As the specific examples of such poly-functional vinyl ethers, there are pentaerythritol tetravinyl ether, p-bis-2-vinyloxyethoxybenzene, 2,2-bis-(3',5'-dibromo-4'-vinyloxyethoxyphenyl)propane, 2,2-bis-(p-vinyloxyethoxyphenyl) propane, tetraethyleneglycol divinyl ether, poly(2-vinyloxyethyl methacrylate), and the like.

As cation-polymerizable N-vinyl compounds, there are N-vinyl-carbazole, N-vinylpyrrolidone, and derivatives thereof (e.g., N-vinyl carbazole substituted with a nitro group, a chlorine atom or a bromine atom.)

The cation-polymerizable compounds can be used alone or in a combination of two or more.

The amount of the acid salt of indolinospirobenzopyran in the photo-polymerizable composition is preferably 0.00001 to 15% by weight, especially preferably 0.001 – 5% by weight, based on the total amount of the cation-polymerizable compound(s).

The photo-polymerizable composition of the invention comprises a photo-cationic polymerization initiator and a cation-polymerizable compound but, in some cases, it may contain other additional components. As the specific examples of such components, there are film-forming binders, sensitizing dyes, colorants, thickening agents, plasticizers, thermally fusible compounds, diluents, insoluble organic or inorganic fillers, and the like. With respect to any of these additives, the amount thereof added can vary widely as long as the photo-polymerization of the light-sensitive composition is not inhibited and the detection of the desired physical changes in the imagewise formed polymer is not inhibited.

The light-sensitive spectral region of the light-sensitive composition of the present invention can be varied by adding a suitable amount (e.g., from about 0.0001 to about 100% by weight, preferably from about 0.001 to about 10% by weight to the weight of the indolinobenzospiropyran salt) of a photographic spectrally sensitizing dye. Usually, the combination of indolinobenzospiropyran and a cation-polymerizable compound is sensitive only to near-ultraviolet light or blue light. However, sensitivity to lights having longer wavelengths can be obtained by adding a spectrally sensitizing dye thereto. Such spectrally sensitizing dyes can be of the dye type or of the dye base type. Of these dyes, those effective for the present invention include the cyanine and merocyanine dyes having a structure in which a simple methine chain bridges the heterocyclic or benzenoid-cyclic fused rings; triphenylmethane dyes; acridine dyes such as Methylene Blue and Thionine; thiazine dyes; xanthene dyes including Rhodamines and Eosines; anthra-quinone dyes; and the like. Suitable such dyes are disclosed in U.S. Pat. Nos. 2,526,632; 2,503,776; 2,493,748; 3,394,486; and 3,503,745. Of these, the cyanine and merocyanine dyes are more effective than others. In order to maintain the system containing these spectrally sensitizing dyes thermally stable, it is preferable that the spectrally sensitizing dye not possess a substituent as basic as or more basic than a dimethylamino group such as methylamino, ethylamino, diethylamino, etc.

A solvent is not an essential component in the present invention but, if necessary, a conventional solvent for dissolving or an inert diluent for dispersing the cation-polymerizable material and the photo-cationic polymerization initiator can be used. As suitable solvents or diluents, there are hydrocarbons such as pentane, cyclohexane, benzene, toluene, etc.; halogenated hydrocarbons such as methylene dichloride, carbon tetrachloride, ethylene dichloride, ethylene bromide, ethylene trichloride, monochlorobenzene, etc.; ethers such as ethyl ether, 1,4-dioxane, diethylene glycol dimethyl ether, etc. Other specific examples include nitrobenzene and liquid sulfur dioxide.

Of the above-described diluents, the halogenated hydrocarbons are preferred since they dissolve the acid salt of indolinospiropyran, the polymerization initiator of the present invention fairly well.

However, it must be noted here that the above-described halogenated hydrocarbons are used as an inert diluent in the invention and essentially do not participate in the photo-polymerization initiation or photo-polymerization reaction.

The disclosure in U.S. Pat. No. 3,515,552, is that halogen-containing organic compounds may be used as a photo-polymerization initiator for vinyl ethers. In this case, the hydrohalogenic acid produced by photolysis is believed to function as a polymerization initiator. However, in the present invention, photo-polymerization can be effected for an extremely short time by irradiating with light in visible region, which does not cause photolysis of hydrogenated hydrocarbons used as the solvent. From this, it can be seen that the photo-polymerization can be initiated with the acid salt of indolinospiropyran using halogenated hydrocarbons merely as a diluent.

As is well known by those skilled in high polymer chemistry, it is believed that the chain termination of the cationic polymerization is not caused by a recombination since propagated chains with similar electric charge repel each other, but is predominantly caused by a reaction with a substance capable of reacting with the end of the propagated chain. Therefore, it is preferable to remove chain-terminating agents such as water, alcohol, amine or the like from the light-sensitive composition of the present invention as much as possible. However, where monomers which are considered to have extremely high cationic polymerization properties, such as N-vinylcarbazole, are used, it is preferable to add a suitable amount of a chain-terminating agent so as to inhibit or control thermal polymerization. Thermal polymerization inhibitors are preferably incorporated in the light-sensitive composition in an amount which is sufficient to inhibit or control thermal polymerization during storage in a dark place before use but does not substantially prevent the progress of the polymerization reaction initiated by irradiation with light. With respect to the amount of the polymerization inhibitor, there exist different suitable ranges depending upon the combination of the photo-cationic polymerization initiator to be used and the cation-polymerizable compound, storage condition of the light-sensitive composition and the exposure conditions.

The present invention can be conducted at temperatures which vary over a wide range and under a pressure which vary over a wide range. When N-vinyl compounds or vinyl ethers are used as the cation-polymerizable material, they can be polymerized with ease at temperatures ranging from about −200° to 100°C, with the temperature range of −20° to 30°C being particularly preferred. The present invention can be practiced under atmospheric, subatmospheric or superatmospheric pressures e.g., about 10 mm Hg to about $10^4$ mm Hg but, particularly preferably, it is conducted under about atmospheric pressure or subatmospheric pressure e.g., about 600 to about 900 mm Hg in a closed system, such as a reaction apparatus, capable of containing the light-sensitive composition of the present invention. Sufficient activation of the photo-cationic polymerization initiator of this invention can be obtained upon exposure for 1 millisecond to a photographic flood lamp.

Since the light-sensitive composition of the present invention undergoes photo-polymerization without being affected by molecular oxygen, it is particularly useful to apply the composition to a plate for use in photo plate-making or a light-sensitive copying paper. In this case, it is preferable to use, if necessary, a film-forming binder inert to the photo-polymerization reaction and disperse in the binder the light-sensitive composition as molecules or fine particles, e.g., a particle size of about 0.01 to about 500 μ, preferably about 0.1 – 10 μ. In such cases, the light-sensitive composition is generally contained in a thin film or layer, which can be supported, if necessary, on a self-supporting material such as papers, plastics, metals, or the like.

As the film-forming binders used in the present invention, there are paraffin, chlorinated paraffin, waxes or like substances; polyolefin chlorides such as polyvinyl chloride, polyvinylidene chloride, etc.; polyacrylic esters and poly-methacrylic esters such as polymethyl methacrylate, polymethyl acrylate, etc.; vinyl or vinylidene polymers other than the vinyl materials previously described, such as polystyrene, polymethylstyrene, polyvinyl carbazole, etc.; polyamides; polycarbonates; cellulose derivatives such as cellulose acetate, cellulose acetate butyrate, ethyl cellulose, etc; vinyl chloride-vinyl acetate copolymers; vinylidene chloride-acrylonitrile copolymers; styrenebutadiene copolymers; polyisobutylenes; phenol-formamide resins; ketone resins; chlorinated rubber; gelatin and polyvinyl alcohol; polyvinyl acetals such as polyvinyl butyral, etc.; and the like.

These film-forming binders can be used in any proportion based on the light-sensitive composition. Generally, the light-sensitive composition is employed in the binder in such an amount that from 1 to 100 percent by weight of the monomer material to the binder is present.

As the support used in the invention, cellulose derivatives such as cellulose acetate, cellulose acetate butyrate, etc.; polyvinyl compounds such as polystyrene, polyvinyl acetal, etc.; polyesters such as polyethylene terephthalate, etc.; poly-γ-olefins comprising $C_2 - C_{10}$ olefins, such as polyethylene, polypropylene, etc.; polycarbonates; metals such as zinc, aluminum, etc.; papers including those laminated with polyethylene or polypropylene, are exemplary. Generally the coating amount on the support is to a thickness of from about 0.1 to 500 μ, preferably about 2 to 200 μ. However, other coating amounts can be used where desired.

The polymerized portions produced by imagewise exposing the photo-polymerizable composition of the invention have physical and chemical properties different from those of the unexposed, non-polymerized portions, and hence the polymerized portions can be visualized by various methods. Specific examples thereof are a process wherein non-polymerized portions are heated to a temperature higher than the softening point e.g., 25° to 300°C, preferably 40° to 150°C and are selectively transferred to another image-receiving paper followed by developing with toner powder; a process wherein a pigment or like toner powder or pigment such as titanium dioxide, colloidal-carbon, phosphor particles, ceramics, clays, metal powders such as aluminum, copper, magnetic iron and bronze, is sprinkled over the photo-polymerization layer to adhere to the unexposed areas followed by transferring it with heat; and the like, as described in U.S. Pat. Nos. 3,060,023 and 3,060,024.

The photo-polymerizable composition of the present invention is colored yellow or orange before exposure but, when exposed, the color fades away to transparency. Therefore, when a plate for use in photo platemaking is prepared using this light-sensitive composition, a photo-faded image is produced simultaneously with the photo hardening. Thus, in the case of repeatedly exposing various portions of a plate, the plate of the invention is extremely convenient since the exposed portions are discriminated from the unexposed portions.

Although the mechanism of the photo cationic polymerization, particularly the mechanism for the initiation, is not yet sufficiently clarified, the following mechanism can be considered to be involved.

The acid salt of the indolinobenzospiropyran is stable in the absence of light in a suitable atmosphere such as in a suitable solvent. The acid salt appears, however, to dissociate into the acid and the spyropyran due to a reduction in the basicity of the photo excited spyropyran portion. It is believed that this dissociated acid can initiate the cationic polymerization of the monomer used in the system.

It seems that the photodissociated acid and the spyropyran reversibly form the original salt in the dark. It is believed that this reverse reaction takes several minutes to several tens of hours to complete under normal conditions. This mechanism appears to be supported by the fact that a polymerization occurs immediately after both the photo-irradiated solution of the indolinobenzospiropyran acid salt and a cationically polymerizable monomer are brought into contact in the absence of light several minutes after the solution of the spiropyran salt is irradiated. The above-described reversible change allows the photo-polymerization to be conducted by using as the photo-polymerizable composition of the invention the composition wherein (A) the acid salt of indolinobenzopyran and (B) the cation-polymerizable compound are separated timewise or spacewise from each other and, after irradiating the compound (A) alone with light, the compound (A) is contacted with the monomer (B). The above-description is given only for the purposes of explaining in greater detail the phenomenon observed of the light-sensitive composition of the invention.

According to the present invention, cation-polymerizable compounds such as vinyl ethers, which are impossible to polymerize by the free radical process widely employed as a photo-polymerization process, can be photo-polymerized. Also, the present invention provides a photo-polymerizable composition whose reactivity is not inhibited by molecular oxygen in the atmosphere. Therefore, the light-sensitive composition of the invention does not require an oxygen-interrupting layer or a nitrogen environment. Furthermore, highly sensitive photo resists, light-sensitive printing plates or the like, which are thermally extremely stable in the dark and which utilize an extremely small amount of exposure for photo-polymerization can be prepared using the light-sensitive composition of the invention.

In addition, since the acid salt of indolinobenzospiropyran used in the composition of the invention has an extremely large molecular extinction coefficient in visible region a tungsten lamp is sufficient as the irradiation light source, even in the absence of spectrally sensitizing dyes. A mercury lamp or a xenon lamp which radiates ultraviolet rays in great amounts is not necessary. Furthermore, since the light-sensitive composition of the present invention simultaneously undergoes photo-hardening and photo-fading at the exposed areas, the exposed areas may be discriminated with ease later.

The photo-polymerizable composition of the invention will now be described by reference to the following examples of the preferred embodiments of the invnvention. These examples are merely exemplary and are not to be interpreted as limiting. Unless otherwise indicated in any way, all parts and percent are by weight.

EXAMPLE 1

2 Grams of p-tert-butyl-phenoxyethyl vinyl ether was dissolved in 15 ml of a 10% acetone solution of cellulose acetate butyrate ester (Half Second Butyrade, made by Eastman Kodak Co., Ltd. molar percent: 37% butyryl and 13% acetyl). Further, a photo-polymerization initiator solution prepared by dissolving 50 mg of 3,3-dimethyl-1-β-ethoxycarbonylethyl-6'-nitrospiro(indoline-2,2'-2'H-chromene) boron trifluoroetherate in 20 ml of acetone was added thereto. The resulting light-sensitive composition was uniformly coated on a biaxially stretched polyethylene terephthalate film of about 100 microns in thickness using a coating rod. Thus, a yellowish orange light-sensitive sheet having coated thereon the light-sensitive composition in a dry thickness of about 2.5 microns was obtained. A positive line original for use in photographic plate-making was intimately superposed on the resulting light-sensitive sheet and the assembly was exposed for 1 minute to a 300 W tungsten lamp for illumination spaced at a distance of 30 cm. The yellowish orange color faded and became almost clear at the exposed areas.

Subsequently, an art paper as an image-receiving paper was placed on a hot plate uniformly heated to 110°C, the abovedescribed exposed sheet was pressed onto the image-receiving paper for about 5 seconds, then the sheet was removed. Areas corresponding to the unexposed areas were selectively transferred to the image-receiving paper. When toner powder was sprinkled over the surface of the image-receiving paper and the excess powder was removed, a visible copy in conformity with the original was obtained.

EXAMPLE 2

2 Grams of 2,2-bis-(p-vinyloxyethoxyphenyl)propane was dissolved in 10 ml of the same 10% acetone solution of cellulose acetate butyrate as used in Example 1, and, further, the same photo-polymerization initiator solution was added thereto in the same amount as used in Example 1. The resulting light-sensitive composition was blade-coated in a dry thickness of about 1.5 microns on an aluminum plate whose surface had been rendered hydrophilic by anodic oxidation. A negative line original for use in photographic plate-making was intimately superposed on the thus prepared light-sensitive printing plate. Then, the assembly was exposed for 2 minutes to a 100 W high pressure mercury lamp of model SHL-100, made by Tokyo Shibaura Electric Co., Ltd., spaced at a distance of 30 cm. The thus exposed printing plate was washed with a methanol-acetone mixture solution (mixing ratio by volume; 2:1) to dissolve away the unexposed areas. When dried, the photo-hardened polymer images became printing ink-receptive and were colored black with a developer for use in offset printing (Black Developer No. 303, made by Fuji Photo Film Co., Ltd.)

EXAMPLE 3

When the same procedures as described in Example 1 were conducted except for using boron trifluoroetherate of 1,3,3-trimethyl-5-ethoxycarbonyl-6'-nitrospiro(indoline-2,2'-2'H-chromene); 3,3-dimethyl-1-hydroxyethyl-6-nitrospiro(indoline-2,2'-2'H-chromene) and 1'-methyl-6-nitro-8-methoxy-2H-chromeme-2-spiro-2'-indoline-3-spiro-1-cyclopentane in place of the boron trifluoroetherate of indolinospirobenzopyran used in Example 1, similar results were obtained.

EXAMPLE 4

When the same procedures as described in Example 1 were conducted except for using 2-(2,4,6-tribromophenoxy)ethyl vinyl ether in place of the vinyl ether used in Example 1, substantially similar results were obtained.

EXAMPLE 5

30.49 Grams of boron trifluoroethrate of 1,3,3-trimethyl-5-ethoxycarbonyl-6'-nitrospiro(indoline-2,2'-2'H-chromene) was dissolved in 305 ml of methylene chloride under a red safe light using a magnetic stirrer to obtain a yellow photo-polymerization initiator solution. 1.0 Gram of N-vinylcarbazole was dissolved in 10 ml of methylene chloride, and 10 ml of the above-described polymerization initiator solution was added thereto and well stirred.

A glass filter, UV-39, made by Tokyo Shibaura Electric Co., Ltd., was fitted as a UV-ray filter to the projector lens of a Superlux-III type slide projector made by Rikagaku Seiki K. K. and an aqueous solution of copper sulfate was placed for filtering out infrared rays. This solution was prepared by dissolving 100 g of copper sulfate trihydrate in 200 ml of water. The light-path length of this filter was 40 mm. Visible light of about 400 – 600 mµ in wavelength was selectively utilized from a tungsten light source using this apparatus.

The above-described photo-polymerizable composition was placed in a drum-shaped cell of 20 mm in light-path length and irradiated for 7 seconds with the visible light described above from the aforesaid apparatus at a distance of 30 cm from projector lens. The yellow color of the solution was observed to almost completely fade away with the irradiation. After allowing the light-sensitive composition to stand at 20°C for 30 minutes, the composition was poured into 100 ml of methanol, precipitating agent, to obtain 0.3 g of poly-N-vinylcarbazole (Reaction System A).

When the above-described light-sensitive composition was tested in the same manner as described above except for irradiation with visible light, substantially no methanol precipitate was obtained (Reaction System B).

When the free light-sensitive composition containing no indolinospirobenzopyran boron trifluoroetherate was irradiated with light and allowed to stand in the same manner as described for Reaction System A, no methanol precipitate was obtained (Reaction System C).

When the same procedures as utilized for Reaction System A were conducted except for using indolinospirobenzopyran at the same molar concentration as in Reaction System A in place of the boron trifluoroetherate of indolinospirobenzopyran used in this Example, no methanol precipitate was obtained (Reaction System D).

Dry air saturated with a solvent, methylene chloride, was passed through the same composition as described in Reaction System A for about 10 minutes before irradiation with light (Reaction System E). Separately, dissolved air was removed from the same composition as described in Reaction System A by freezing and thawing followed by intimate sealing (Reaction System F). When these Reaction Systems E and F were treated subsequently in the same manner as described in Reaction System A, polymer in substantially the same yield as in Reaction System A was obtained.

From the above results, the following can be seen.
1. Indolinobenzospiropyran boron trifluoroetherate of this example is a photo polymerization initiator having low thermal polymerization properties.
2. Ethylene dichloride functions as a diluent in this Example.
3. Free indolinospirobenzopyran is not a photo-polymerization initiator.
4. The process of the present invention is not inhibited by air (or oxygen).

tion nor an increase in viscosity due to polymerization was observed for 2 hours.

Furthermore, the same procedures as described in this Example were conducted utilizing various vinyl ethers. The results obtained are shown in Table 2.

Table 2

| Run No. | Vinyl Ethers | Monomer | Photo Polymerization Initiator | Induction Period of Photo Polymerization |
|---|---|---|---|---|
| 1 | 2-Methoxyethyl Vinyl Ether | 5 ml | 2 ml | 2 sec. |
| 2 | 2-Phenoxyethyl Vinyl Ether | 3 ml | 2 ml | 10 sec. |
| 3 | 2-(3,5-Dimethyl-phenoxy)ethyl Vinyl Ether | 3 ml | 2 ml | 18 sec. |
| 4 | 2-(2,4,6-Tribromophenoxy)-Ethyl Vinyl Ether | 3 ml | 2 ml | 25 sec. |

EXAMPLE 6

Photo-polymerization initiator solutions of the same weight concentration as described in Example 5 were prepared using boron trifluoroetherate of 1,3,3-trimethyl-8'-formyl-spiro(indoline-2,2'-2'H-chromene); 3,3-dimethyl-1-hydroxyethyl-6'nitrospiro(indoline-2,2'-2'H-chromene); 3,3-dimethyl-1-(β-ethoxycarbonylethyl)-6'-nitrospiro(indoline-2,2'-2'H-chromene) of 1'-methyl-6-nitro-8-methoxy-2H-chromene-2-spiro-2'-indoline-3'-spiro-1''-cyclopentane in place of 1,3,3-trimethyl-5-ethoxycarbonyl-6'-nitrospiro(indoline-2,2'-2'H-chromene) boron trifluoroetherate used in Reaction System A of Example 5. When the same procedures as described in Example 1, Reaction Systems A, B and C were subsequently conducted, the same results as described in Example 1 were obtained.

EXAMPLE 7

5 mg of 3,3-dimethyl-1-β-ethoxycarbonylethyl-6'-nitrospiro(indoline-2,2'-2'H-chromene) boron trifluoroetherate was dissolved in 10 ml of 1,2-dichloroethane in the dark to prepare a photo-polymerization initiator solution. 5 ml of isobutyl vinyl ether and 2 ml of the above-described photo-polymerization initiator were placed in a hard glass double walled adiabatic test tube. This reaction vessel was placed in a thermostat water bath maintained at 20°C and irradiated with visible light of about 400 – 600 mμ in wavelength emitted from a 1 KW tungsten lamp at a distance of 30 cm using the same irradiation apparatus as used in Example 1. Within 2 seconds from the irradiation with light, a violent exothermic reaction occurred based on the polymerization and, after about 2 minutes, the reaction mixture became a viscous liquid due to the polyisobutyl vinyl ether produced. On the other hand, when the same composition as described above was left in the dark without irradiation with light, neither heat genera-

EXAMPLE 8

5 ml of isobutyl vinyl ether and 2 mg of 1,3,3-trimethyl-6'-nitro-spiro(indoline-2,2'-2'H-chromene) boron trifluoroetherate were added to a hard glass double-walled adiabatic test tube and well stirred in the dark for 30 minutes to obtain a saturated solution. This reaction vessel was then immersed in a 20°C thermostat and irradiated with light emitted from a 100 W high pressure mercury lamp of SHLS-100A type, made by Tokyo Shibaura Electric Co., Ltd., spaced at a distance of 30 cm. After about 10 seconds, an exothermic reaction based on the photo polymerization was observed.

EXAMPLE 9

2 ml of the same photo-polymerization initiator solution as described in Example 3 was added to a hard glass test tube and irradiated with visible light for 10 seconds using the same irradiation apparatus as used in Example 5. When this irradiated photo-polymerization initiator solution was added to 5 ml of isobutyl vinyl ether contained in another reaction vessel stored in the dark, a violent polymerization reaction took place and a reddish brown, viscous liquid was obtained.

EXAMPLE 10

The same procedures as in Example 9 were conducted except for allowing the irradiated photo-polymerization initiator to stand in the dark for 10 minutes or 100 minutes, and similar results were obtained.

EXAMPLE 11

This Example demonstrates that spectrally sensitized photo-polymerization can be attained by using a merocyanine dye.

30 mg of 3-ethyl-5-[(3-ethyl-2-benzothiazolinylidene) ethylidene]-rhodamine was dissolved in 100 ml of 1,2-dichloroethane. 2 ml of this dye solution was added to the same light-sensitive mixture of isobutyl vinyl ether and indolinospirobenzopyran boron trifluoroetherate as used in Example 3. Another glass filter, V-052, made by Tokyo Shibaura Electric Co., Ltd., was combined in place of the glass filter, UV-39, in the irradiation apparatus used in Example 3 to thereby filter the light of wavelengths corresponding to the light absorption of the indolinobenzospiropyran boron trifluoroetherate. Thus, light of a wavelength which the spectrally sensitizing dye alone substantially absorbs were used, i.e., wavelengths shorter than 520 mμ which do not substantially affect the indolino-benzospiropyran. The sample was tested under the same conditions as described in Example 3 except for using the above-described apparatus. When the sample was allowed to stand for more than 30 minutes in the dark, no exothermic reaction was observed. However, when irradiated with light, an exothermic reaction based on polymerization occurred within 30 seconds. Thus, a viscous polyisobutyl vinyl ether solution was obtained.

EXAMPLE 12

When the same procedures as described in Example 7 were conducted except for using hydrochloric acid or p-toluenesulfonic acid salt in place of indolinobenzospiropyran boron trifluoroetherate, similar results were obtained.

While the invention has been described in detail and with reference to specific embodiments thereof, it will be apparent to one skilled in the art that various changes and modifications can be made therein without departing from the spirit and scope thereof.

What is claimed is:

1. A photo-polymerizable composition comprising (A) a photo-polymerization initiator comprising at least one inorganic or organic acid salt of a Lewis acid or proton acid effective as an initiator for cationic polymerization and an indolinobenzospiropyran represented by the following general formula (I):

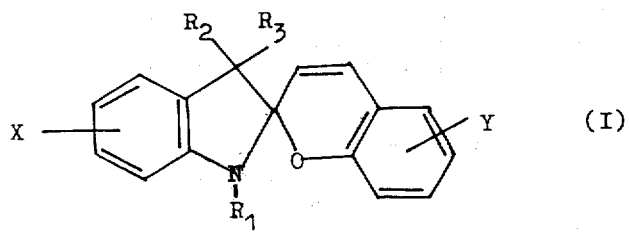

wherein $R_1$ represents an alkyl group, substituted alkyl group or a phenyl group; $R_2$ and $R_3$ each represents an alkyl group or a phenyl group or, when taken together, $R_2$ and $R_3$ form a methylene chain $(CH_2)_n$ wherein $n$ is an integer of 4 to 5; X represents a hydrogen atom, a nitro group, a halogen atom, a carboxy group, an alkoxycarbonyl group, an alkyl group or an alkoxy group; and Y represents one or more substituents selected from the group consisting of a hydrogen atom, a nitro group, a halogen atom, a formyl group and an alkoxy group, and (B) at least one cationically polymerizable substance having an ethylenically unsaturated bond or having a cyclic group capable of ring-opening for polymerization.

2. The photo-polymerizable composition as described in claim 1, wherein $R_1$ represents an alkyl group having 1 - 5 carbon atoms; a substituted alkyl group having 1 - 5 carbon atoms, said substituent being a carboxy group, cyano group, an alkoxycarbonyl group having 1 - 5 carbon atoms, a hydroxy group, a halogen atom, an alkoxy group having 1 - 5 carbon atoms or a phenyl group; or a phenyl group or, when taken together, $R_2$ and $R_3$ form a methylene chain $(CH_2)_n$ wherein $n$ is an integer of 4 or 5; X represents a hydrogen atom, a nitro group, a halogen atom, a carboxy group, an alkoxycarbonyl group having 2 - 6 carbon atoms, an alkyl group having 1 - 5 carbon atoms or an alkoxy group having 1 - 5 carbon atoms; and Y represents one or more substituents selected from the group consisting of a hydrogen atom, a nitro group, a halogen atom, a formyl group and an alkoxy group having 1 - 5 carbon atoms.

3. The photo-polymerizable composition as described in claim 2, wherein said acid salt of indolinobenzospiropyran (A) is capable of forming free acid when irradiated with an actinic radiation of 250 - 700 mμ in wavelength.

4. The photo-polymerizable composition as described in claim 2, wherein said acid salt of said indolinobenzospiropyran (A) comprises at least one salt selected from the hydrochloric salt, nitrate salt, perchlorate salt, acetate salt, sulfanilate salt, benzenesulfonate salt, toluenesulfonate salt, dinitro-o-cresol salt, picrate salt, salicylate salt, boron trifluoroetherate, ferric chloride salt, titanium trichloride salt, and stannous chloride salt.

5. The photo-polymerizable composition as described in claim 2, wherein said cation-polymerizable substance comprises at least one of the vinyl ethers or the N-vinyl compounds.

6. The photo-polymerizable composition as described in claim 5, wherein said vinyl ether is a compound represented by the general formula (II):

7. The photo-polymerizable composition as described in claim 6, wherein said compound represented by the general formula (II) is methyl vinyl ether, ethyl vinyl ether, isobutyl vinyl ether, diisopropylmethyl vinyl ether, decyl vinyl ether, cetyl vinyl ether, 2-chloroethyl vinyl ether, 2-methoxyethyl vinyl ether, 2-(2-ethoxyethoxy)-ethyl vinyl ether, 2-phenoxyethyl vinyl ether, α-naphthoxyethyl vinyl ether, 2-(2,4,6-trichlorophenoxy)-ethyl vinyl ether, 2-(2,4,5-trichlorophenoxy)-ethyl vinyl ether, 2-(2,4,6-tribromophenoxy) ethyl vinyl ether, p-methoxy-naphthoxyethyl vinyl ether, p-methoxyphenoxyethyl vinyl ether, 2-vinyloxyethyl benzoate, 3,5-dimethylphenoxyethyl vinyl ether, pentaerythritol tetravinyl ether, p-bis-2-vinyloxyethoxybenzene, 2,2-bis-(3',5'-dibromo-4'-vinyloxyethoxyphenyl)propane, 2,2-bis-(p-vinyloxyethoxyphenyl) propane, tetraethylene glycol divinyl ether or poly(2-vinyloxyethyl methacrylate).

8. The photo-polymerizable composition as described in claim 5, wherein said N-vinyl comound is wherein X represents an alkyl group having 1 - 20 carbon atoms or a substituted alkyl group having 1-5 carbon atoms, said substituent being a halogen atom, an alkoxy group having 1 - 10 carbon atoms, an alkyl group in which the carbon chain is interrupted with at least one oxygen atom, an aryloxy group, an arylcarboxy group, a haloaryloxy group, an alkylaryloxy group having 1 - 5 carbon atoms in the alkyl moiety, or an alkoxyaryloxy having 1 - 5 carbon atoms in the alkoxy moiety.

N-vinylcarbazole, N-vinylpyrrolidone or derivatives thereof.

9. The photo-polymerizable composition as described in claim 2, wherein the amount of said acid salt of indolinobenzospiropyran (A) is 0.0001% to 15% by weight based on the total amount of the cation-polymerizable compound (B).

10. The photo-polymerizable composition as described in claim 2, wherein said photo-polymerizable composition contains a spectrally sensitizing dye.

11. The photo-polymerizable composition as described in claim 10, wherein said sentizing dye is at least one of cyanine dyes, the merocyanine dyes, the triphenylmethane dyes, the acridine dyes, the thiazine dyes, the xanthene dyes or the anthraquinone dyes.

12. The photo-polymerizable composition as described in claim 2, wherein said photo-polymerizable composition contains at least one of a colorant, a thickening agent, a plasticizer, a thermally fusible compound, a diluent or an organic or inorganic filler.

13. The photo-polymerizable composition as described in claim 2, wherein said photo-polymerizable composition contains a film-forming binder.

14. The photo-polymerizable composition as described in claim 13, wherein said film-forming binder is at least one of paraffin, chlorinated paraffin, wax, polyolefin chloride, polyacrylic ester, polymethacrylic ester, vinyl polymer, vinylidene polymer, polyamide, polycarbonate, cellulose derivative, vinyl chloride-vinyl acetate copolymer, vinylidene chlorideacrylonitrile copolymer, styrene-butadiene copolymer, polyisobutylene, phenol-formamide resin, ketone resin, chlorinated rubber, gelatin, polyvinyl alcohol, or polyvinyl acetal forming binder.

15. A photo-polymerizable light-sensitive material comprising a support having thereon the photo-polymerizable composition as described in claim 2.

16. The photo-polymerizable light-sensitive material as described in claim 15, wherein said support is a cellulose derivative film, a polyvinyl compound film, a polyester film, a poly-γ-olefin film, said olefin having 2 - 10 carbon atoms, a polycarbonate film, a polyolefin laminated paper, a polyolefin laminated metal plate, a polyolefin laminated ceramic plate, a metal plate or a ceramic plate.

* * * * *